(12) United States Patent
Jiang et al.

(10) Patent No.: US 9,685,577 B2
(45) Date of Patent: Jun. 20, 2017

(54) LIGHT EMITTING DIODES AND PHOTODETECTORS

(71) Applicant: The Penn State Research Foundation, University Park, PA (US)

(72) Inventors: Zhenyu Jiang, State College, PA (US); Jian Xu, State College, PA (US); Jie Liu, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 15/024,191

(22) PCT Filed: Oct. 15, 2014

(86) PCT No.: PCT/US2014/060591
§ 371 (c)(1),
(2) Date: Mar. 24, 2016

(87) PCT Pub. No.: WO2015/057771
PCT Pub. Date: Apr. 23, 2015

(65) Prior Publication Data
US 2016/0233370 A1   Aug. 11, 2016

Related U.S. Application Data

(60) Provisional application No. 61/891,089, filed on Oct. 15, 2013.

(51) Int. Cl.
*H01L 31/12* (2006.01)
*H01L 27/15* (2006.01)
(Continued)

(52) U.S. Cl.
CPC ........... *H01L 31/125* (2013.01); *H01L 27/15* (2013.01); *H01L 31/03044* (2013.01);
(Continued)

(58) Field of Classification Search
CPC ............ H01L 27/15; H01L 31/03044; H01L 31/03048; H01L 31/1035; H01L 31/125; H01L 31/173; H01L 33/08; H01L 33/32
See application file for complete search history.

(56) References Cited

U.S. PATENT DOCUMENTS

| | | | |
|---|---|---|---|
| 2002/0101895 A1* | 8/2002 | Augusto | B82Y 20/00 372/44.01 |
| 2007/0034898 A1* | 2/2007 | Tennant | H01L 31/02966 257/184 |

(Continued)

FOREIGN PATENT DOCUMENTS

| | | | | |
|---|---|---|---|---|
| GB | 1503065 A | * | 3/1978 | ............ H01L 31/12 |
| KR | 1020020012945 | | 2/2002 | |
| KR | 1020080052232 | | 6/2008 | |

OTHER PUBLICATIONS

International Search Report of the International Searching Authority for PCT/US2014/060591 dated Jan. 15, 2015.
(Continued)

*Primary Examiner* — Allan R Wilson
(74) *Attorney, Agent, or Firm* — Buchanan Ingersoll & Rooney PC

(57) ABSTRACT

The present application relates generally to light emitting diodes and photodetectors as well as their methods of manufacture and use. In one exemplary embodiment, an integrated device may include a substrate, a light emitting diode formed on the substrate, and a photodetector formed on the substrate. In another embodiment, a device may include a light emitting diode formed on a substrate, and the light emitting diode may act as both a solid state light and as an optical transmitter.

20 Claims, 4 Drawing Sheets

(51) Int. Cl.
*H01L 33/32* (2010.01)
*H01L 31/103* (2006.01)
*H01L 31/173* (2006.01)
*H01L 31/0304* (2006.01)
*H01L 33/08* (2010.01)

(52) U.S. Cl.
CPC .... *H01L 31/03048* (2013.01); *H01L 31/1035* (2013.01); *H01L 31/173* (2013.01); *H01L 33/08* (2013.01); *H01L 33/32* (2013.01)

(56) References Cited

U.S. PATENT DOCUMENTS

| | | | |
|---|---|---|---|
| 2010/0133551 A1 | 6/2010 | Lee et al. | |
| 2011/0057129 A1* | 3/2011 | Yao | G01S 7/4813 250/552 |
| 2011/0186736 A1* | 8/2011 | Yao | H01L 31/0203 250/338.4 |
| 2011/0216795 A1* | 9/2011 | Hsu | B82Y 20/00 372/44.011 |

OTHER PUBLICATIONS

Written Opinion of the International Searching Authority for PCT/US2014/060591 dated Jan. 15, 2015.

* cited by examiner

LIGHT EMITTING DIODES AND PHOTODETECTORS

FIELD

Disclosed embodiments are related to light emitting diodes and photodetectors.

BACKGROUND

In wireless optical communication systems (also referred to as "free-space optical communication" systems), data communication is performed by propagating optical signals (e.g., visible light, infrared light, ultraviolet light, or any other suitable optical signals) through a wireless medium (e.g., air, a vacuum, or any other suitable medium). Wireless optical communication systems are, in some cases, superior to fiber optic communication systems in terms of accessibility, cost, and network deployment. Light emitting diodes (LEDs) may be used as optical transmitters in wireless optical communication systems. Additionally, optical communication systems will also include an optical receiver to transform incident light into a detectable signal which is transmitted to an associated processor. An appropriate photodetector is typically used as the optical receiver in a wireless optical communication system.

In addition to wireless optical communication systems, solid-state lighting refers to lighting technology that uses light-emitting diodes (LEDs) to produce light. Solid-state lighting may be used, for example, in street lights, vehicle headlights, or for indoor and outdoor lighting. Light emitting diodes, including LEDs for solid-state lighting applications, are sometimes fabricated using the semiconductor materials gallium nitride (GaN) or indium gallium nitride (InGaN).

SUMMARY

In one embodiment, an integrated device includes a substrate, a light emitting diode formed on the substrate, and a photodetector formed on the substrate.

In another embodiment, a device includes a light emitting diode formed on a substrate, and the light emitting diode is configured to function as both a solid state light and as an optical transmitter.

In yet another embodiment, an optical communication system includes a first transmitting light emitting diode associated with a first receiving photodetector and a second transmitting light emitting diode associated with a second receiving photodetector. The first receiving photodetector is configured to be blind to the first light emitting diode and to receive emissions from the second light emitting diode. Additionally, the second receiving photodetector is configured to be blind to the second light emitting diode and to receive emissions from the first light emitting diode.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1A:
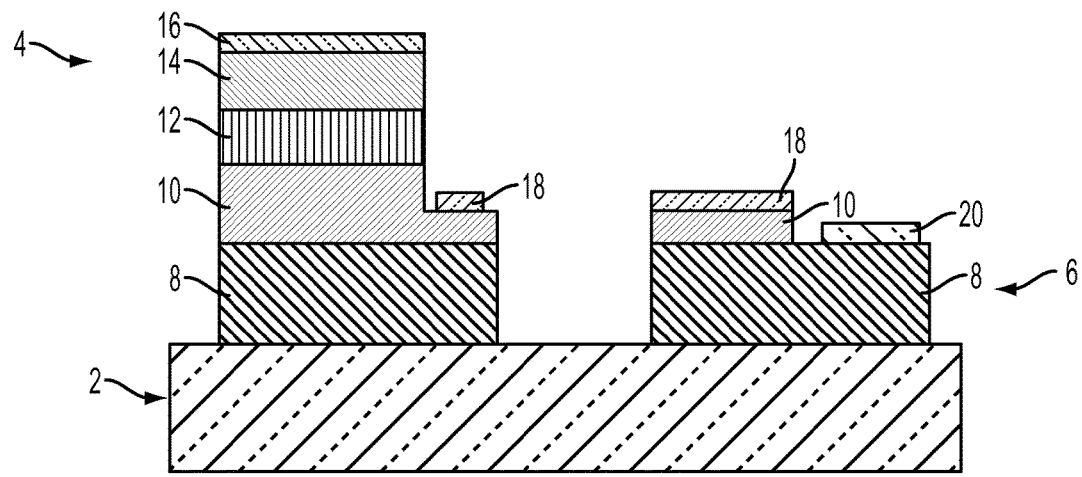
FIG. 1A is a schematic representation of an integrated light emitting diode and Schottky barrier photodetector.

Solid-state lighting (SSL) based on LEDs has great potential to be the technology to replace traditional lamp-based lighting systems. For example, color LEDs have already replaced traditional lamps in applications such as traffic lights, signs, and displays. Additionally, low price and high quality white LED light sources using blue III-nitride LED chips and down-conversion phosphors have recently been developed and made commercially available. Moreover, since the operation mechanism of III-nitride LEDs is based on the p-n junction that is the foundation of the modern semiconductor industry, it is envisioned that in addition to solid-state lighting, white LEDs may also be used for communication, sensing, navigation, imaging, and many other appropriate applications. In particular, when white LEDs are used as communication transmitters, they offer many favorable characteristics, such as low cost, high brightness, low power consumption, high lifetime expectancy, high data rate, interference-free and low security risk, which cannot be matched by conventional RF wireless communication systems. For example, recently, white LEDs have been reported to transmit data at a high bandwidth of 500 Mb/s rate over a 5 m-distance, making them highly suitable for indoor wireless communication.

In view of the above, the use of dual-function LEDs operating in the visible spectrum, such as white LEDs, for indoor and/or outdoor lighting as well as for wireless communication has great potential for applications under many circumstances. However emission wavelengths both greater and less than the visible spectrum are also contemplated. Several possible nonlimiting applications include on-plane cabin internet connections, RF interference-free hospital data transmission, indoor television and radio reception, street lighting-based venue networks, secure information transmission down a convoy of military vehicles, as well as smart automobiles to name a few. These LEDs which may be used for both lighting and/or data transfer purposes may be combined with an appropriate photodetector to provide a downlink for the transmitted information. In one embodiment, the LED and photodetector may be integrated into the same substrate. For example, one or more LEDs and one or more photodetectors may be integrally formed on the same substrate using any appropriate combination of formation techniques. The integrated devices noted above can be used for any appropriate application including, but not limited to, dual channel optical wireless communication applications.

In addition to the above, in some embodiments the emission wavelengths of the LED are different from the absorption wavelengths of the photodetector. In other words, in some embodiments, the photodetector is blind to the emissions of the neighboring LED. When the photodetector is blind to the emissions of the neighboring LED, the device does not require the use of filters on the photodetector to avoid excitation from the neighboring LED. Therefore, in some embodiments, the integrated device does not include a filter associated with the photodetector. However, it should be understood that in some embodiments, it may be beneficial to include one or more filters associated with the photodetector for filtering one or more desired wavelengths including wavelengths associated with the LED and/or other external sources. Further, while in some embodiments the LED and photodetector are associated with different ranges of wavelengths, in other embodiments, the LED and photodetector might have operational ranges of wavelengths that overlap, or are the same, as the current disclosure is not limited in this fashion.

It may also be desirable to integrate an LED and a photodetector on a single substrate to decrease overall production costs and simplify the manufacturing process. Such an integrated device may also offer benefits such as increased emission power and detection thresholds. However, the etching processes typically used to form an LED, including for instance, inductively coupled plasma (ICP) processes, result in the introduction of multiple surface defects into a photodetector integrated in the same substrate. For example, an etching process might introduce multiple surface defects to the Schottky interface of a photodetector. Without wishing to be bound by any particular theory, these defects generally result in severe degradation of a photodetector's performance.

In some embodiments, it is desirable to maintain the typical methods of forming the LED due to the sensitivity of the LED to changes in the formation process. LEDs formed in indium gallium nitride (InGaN) may have desirable properties, including, but not limited to, high heat capacity and high efficiency. InGaN LEDs may also be fabricated to emit wavelengths that vary over a wide spectrum ranging from near ultraviolet wavelengths to red wavelengths. The high efficiency of InGaN LEDs may be particularly beneficial in solid-state lighting applications. Consequently, semiconductor process technology for fabricating InGaN LEDs may be more advanced, more widely available, more efficient, and/or less expensive than semiconductor process technology for fabricating some other types of LEDs. Therefore, in some embodiments, the inventors have recognized that it is desirable to provide a photodetector that is compatible with the typical formation processes of various LEDs, including, but not limited to standard semiconductor fabrication processes for fabricating InGaN LEDs. In some other embodiments, one or more LEDs for solid-state lighting, one or more LEDs for optical communication, and one or more photodetectors for optical communication may be fabricated using the same semiconductor fabrication process and/or monolithically integrated into the same integrated circuit.

It should be understood that while particular LEDs are discussed herein, the current disclosure is not limited to any particular type of LED or operational range of wavelengths. For example, in one embodiment, an LED emits light in at least a portion of the visible spectrum extending from about 400 to 760 nm. For example, a blue light LED might have an emission wavelength range between about 440 nm and 460 nm. In other embodiments an LED might operate with wavelengths that are greater than about 400 nm, 500 nm, 600 nm, 700 nm, or any other appropriate wavelength. Additionally, such an LED might operate with wavelengths that are less than about 760 nm, 700 nm, 600 nm, 500 nm, or any other appropriate wavelength. Combinations of the above noted ranges of wavelengths are possible including, for example, wavelengths between about 500 nm to 700 nm. However, emission wavelengths both greater than and less than those noted above, including the ultraviolet and infrared spectrums, are also contemplated.

Depending on the particular embodiment, various types of photodetectors might be used in conjunction with the noted LEDs. For example, a p-n junction photodetector, p-i-n junction photodetector, metal-semiconductor-metal (MSM) photodetector, and/or any other appropriate photodetector might be used as the current disclosure is not so limited. In addition to the other possible embodiments, the inventors have recognized that the high performance, visible-blind property, and easy fabrication of a Schottky barrier photodetector may be particularly suited to integration with a neighboring LED in a single device while using standard LED formation techniques. Additionally, depending on the embodiment, the photodetector may operate in the ultraviolet, visible, infrared wavelengths, or any other desired range of wavelengths. For instance, in one embodiment, a photodetector may operate in the ultraviolet wavelength range extending from about 240 nm to 400 nm. In some embodiments, the photo detector is a III-nitride ultraviolet photodetector.

In one specific embodiment, the LED is a blue light LED with an emission range of about 440 nm to about 460 nm. Additionally, in such an embodiment, the photodetector may be an ultraviolet light photodetector and may have any appropriate absorption range less than about 400 nm or less than about 380 nm. For example, the photodetector may have an absorption range between about 200 nm to about 375 nm. However, other emission and absorption ranges are also possible and may be selected based on appropriate design considerations.

In one specific embodiment, an indium gallium nitride (InGaN) based LED and a gallium nitride (GaN) Schottky barrier photodetector are integrated on the same chip. As described in more detail below in the examples, the high performance GaN photodetector can exhibit responsivities as high as 0.2 $AW^{-1}$ under 365 nm wavelength excitation which is comparable to epitaxially grown GaN Schottky barrier photodetectors. The excellent visible-blind properties of the GaN photodetector also enable the integrated device to function properly under low illumination down to at least $7.16 \times 10^4$ $W/cm^2$. While a specific LED and photodetector combination is noted above, other types of materials might also be used. For example, the photodetector and LED might be based on a GaAs system or any other appropriate material system as well.

The currently disclosed LEDs and photodetectors may be formed using any appropriate materials. For example, in some embodiments, an LED and/or photodetector may be formed with materials such as silicon (Si), germanium (Ge), and/or gallium arsenide (GaAs). In another embodiment, an LED and/or photodetector may be formed using one or more III-Nitride based epitaxial layers such as gallium nitride (GaN) and/or indium gallium nitride (InGaN). Regardless of the particular material used, the layers may be p doped, n doped, undoped, or any other variation to provide the desired properties in a device. Additionally, any appropriate contact materials, seed layers, barrier layers, vias, connects, and other appropriate structures may be used with the currently described LEDs and photodetectors as the disclosure is not so limited.

Turning now to the figures, several specific embodiments are described in more detail. However, it should be understood that the various components and features described in the depicted embodiments may be used either individually or in any appropriate combination as the disclosure is not limited to the specific embodiments described herein.

FIG. 1A depicts one embodiment of an integrated device including a substrate 2 as well as an LED 4 and a photodetector 6 formed on the substrate. In some embodiments, the LED comprises a p-n junction. The substrate may correspond to any appropriate insulating material including sapphire, silicon dioxide, an insulative layer on silicon (e.g. silicon dioxide or other insulator on silicon), silicon carbide, and/or any other appropriate substrate. Depending on the embodiment and application, the substrate may be transparent, semi-transparent, or opaque. For example, the use of a single crystal sapphire substrate would provide a transparent substrate. In some embodiments, the substrate may be a single crystal material oriented in a particular direction to facilitate growth of the subsequent layers. For example, in one embodiment, the substrate is a single crystal sapphire substrate and the LED 4 and photodetector 6 are formed on the c-face (0001). The layers deposited on the substrate may be applied in any appropriate fashion including electron beam evaporation, thermal evaporation, laser ablation, chemical vapor deposition, thermal evaporation, plasma assisted chemical vacuum deposition, laser enhanced chemical vapor deposition, jet vapor deposition, metalorganic chemical vapor deposition (MOCVD), a combination of the above, and/or any other appropriate method.

Figure 1B:
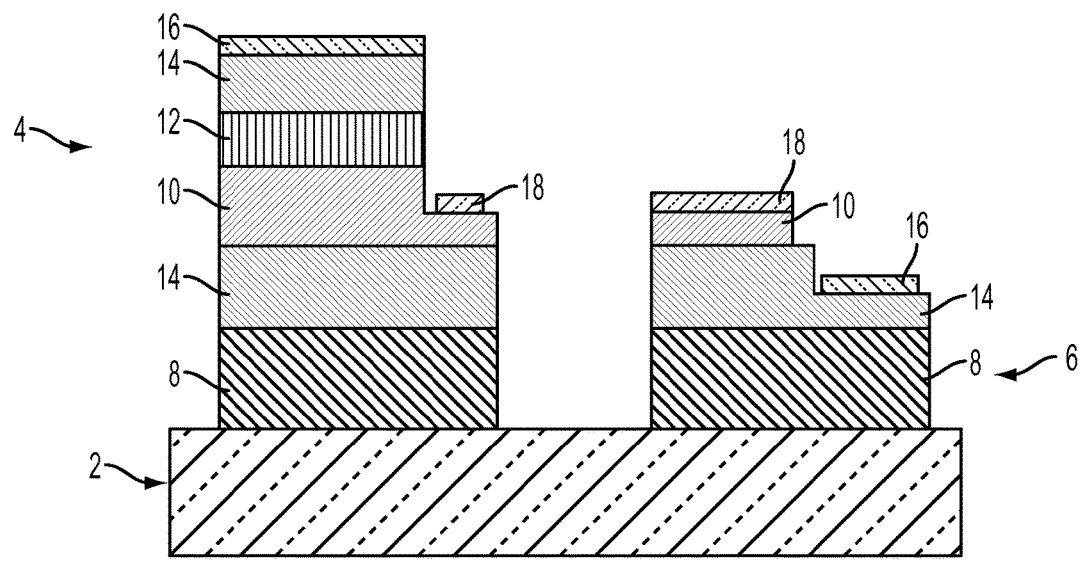
FIG. 1B is a schematic representation of an integrated light emitting diode and p-n junction photodetector.

An undoped material 8 is deposited on the substrate 2 using typical photolithography and etching processes, including for example an inductively-coupled plasma (ICP) etch, to form separate mesa structures associated with the LED 4 and photodetector 6. A post etch treatment with an appropriate oxidizer may be used to passivate the surface of the undoped material. After passivation, a Schottky contact 20 is formed on the undoped material associated with the photodetector 6 using appropriate photolithography and etching processes. An n-type material 10 is then formed on selected portions of the undoped material 8. Depending on the embodiment, the n-type material 10 on the photodetector 6 and a portion of the n-type material 10 on the LED 4 is then etched to a desired shape and/or thickness prior to depositing an n-type contact 18 on both structures. Subsequently, in some embodiments, a material 12 exhibiting multiple quantum wells is deposited on the exposed surface of the n-type material 10 of the LED 4. However, other appropriate materials may be used. A p-type material 14 is then deposited on the material 12 and a p-type contact 16 is formed on the p-type material 14. Again all these layers are formed using typical photolithography and etching processes as would be known to one of ordinary skill in the art. Appropriate annealing methods may also be applied to ensure appropriate formation of the various contacts. Further, while specific structures are depicted in the figures, modifications to the arrangements of the depicted structures are possible. Therefore, the current disclosure should not be interpreted as being limited to only the embodiments described with respect to FIG. 1A. For example, a device including an LED 4 and photodetector including a p-n junction is depicted in FIG. 1B. The depicted embodiment is similar to that shown in FIG. 1A with the addition of a p-doped layer, such as a p-doped GaN epitaxial layer, deposited between the undoped material 8 and n-type material 10 of both the LED 4 and photodetector 6. Additionally a p-type contact material 16 may be deposited on the p-type material of the photodetector to form one of the contacts for the p-n junction photodetector.

As noted above, in one embodiment, LED 4 may be an indium gallium nitride (InGaN) based LED and the photodetector may be a gallium nitride (GaN) Schottky barrier photodetector. In such an embodiment, the undoped material is undoped gallium nitride (u-GaN), the n-type material is n-doped gallium nitride (n-GaN), the p-type material is p-doped gallium nitride (p-GaN), and the multiple quantum well material includes InGaN and GaN. The p-type contact 16, n-type contact 18, and Schottky contact 20 may also correspond to any appropriate material or combination of materials. In this embodiment: the p-type contact 16 includes subsequent layers of nickel and silver; the n-type contact 18 includes subsequent layers of titanium, aluminum, titanium, and gold; and the Schottky contact 20 includes subsequent layers of nickel, aluminum, titanium, and gold.

In one embodiment, a first transmitting LED 4 and a second receiving photodetector 6, forming at least a portion of an optical communication system, may be distanced from each other by any appropriate distance over which they are able to effectively communicate. For example, the LED and photodetector are configured such that they may communicate when distanced from one another by less than or equal to 20 m, 15 m, 10 m, 5 m, 1 m, 0.5 m, or any other appropriate distance. In one specific embodiment, the transmitting LED and receiving photodetector are configured to communicate with one another when located between about 1 m and 20 m apart. In such an embodiment the first transmitting LED may be associated with first receiving photodetector and the second receiving photodetector may be associated with a second transmitting LED. Depending on the embodiment, the first receiving photodetector may be blind to the first LED and capable of sensing emissions from the second LED and the second receiving photodetector may be blind to the second LED and capable of sensing emissions from the first LED. For example the first LED may emit visible light and the second receiving photodetector may receive visible light while the second LED may emit ultraviolet light and the first receiving photodetector may receive ultraviolet light. Consequently, the combination of LEDs and photodetectors on separate devices may receive and send signals between them without cross talk between adjacent components on the same devices.

The LED 4 and photodetector 6 may also have any appropriate combination of effective areas depending on the relative device efficiencies and the desired emission powers of the LED and expected signal strengths for detection by the photodetector. Without wishing to be bound by theory, in general, high power and brightness are associated with large LED surface areas, while high bandwidth and speed are associated with smaller detector surface area. Therefore, in one exemplary embodiment, the LED may have a surface area between about 100 $\mu m^2$ to about 100 $cm^2$ and the detector might have a surface area between about 1 $\mu m^2$ to about 10 $cm^2$ While specific values are noted above, it should be understood that the areas used will be application specific, and that the current disclosure is not limited to just the values disclosed above.

Samples

The construction of samples used in the examples are described in detail below.

Samples were grown on c-face (0001) sapphire substrates by metalorganic chemical vapor deposition (MOCVD) similar to the schematic device depicted in FIG. 1. The devices include 2.6 μm of undoped GaN (u-GaN), 2 μm n-GaN, 1 nm InGaN/GaN with multiple quantum wells, and a 100 nm p-GaN cap. The LED and UV detector mesa structures were formed by standard photolithography and ICP etch processes. The n-type Ohmic contact was deposited using evaporated Ti/Al/Ti/Au for both the LED and GaN photodetector. The p-type contact for the LED was deposited by subsequently sputtering Ni and Ag. The Schottky contact of the GaN detector on the u-GaN was formed using evaporated Ni/Al/Ti/Au. The effective area of the LED and UV detector were 295 μm×255 μm and 127 μm×20 μm, respectively. The distance between the LED and Schottky barrier UV detector was 250 μm.

The current-voltage (I-V) characteristics of the LED and UV detector presented below were measured using a Keithley 2612 analyzer. To obtain the spectral response of the detector, the devices were irradiated under monochromatic light using a Newport monochromator with a xenon lamp as the light source. The illumination intensities were measured using a calibrated Newport 818UV and Newport 818 for UV and visible ranges respectively.

As described in more detail below, despite using ICP etching during fabrication of the integrated device, the fabricated InGaN light-emitting-diode (LED) and GaN Schottky barrier photodetector formed on the same chip exhibit responsivities as high as 0.2 $AW^{-1}$ at −10 V bias for 365 nm ultraviolet light. The InGaN LED also emitted visible light at 450 nm with power output up to 25.6 mW as a signal transmitter, meanwhile the GaN photodetector acted as a receiver to analyze UV light signals as low as $7.16\times10^{-4}$ $W/cm^2$ without interference from the LED emissions due to its superior visible-blind properties. Spectral responsivity measurements also indicate an excellent visible-blind property of photodetector. Specifically, the responsivity at UV range is nearly two orders of magnitude higher than that at visible range which makes the GaN photodetector suitable for visible-blind application. It was also found that the InGaN LED and GaN Schottky barrier can efficiently work together when the UV signal is as low as 7.16×10−4 $W/cm^2$. These results are comparable to epitaxially grown Schottky barrier GaN photodetectors which do not involve ICP etch processes during their fabrication. In view of these properties, the integrated InGaN LED and GaN photodetectors are capable of being integrated to form a single device that functions both as a transmitter to emit visible signal and as a receiver to analyze a UV signal. As noted above, such a device might be used for dual channel optical wireless communication applications and other appropriate applications. For example, the LED may be used as a transmitter for a communication channel, and the photodetector may be used as a receiver for another communication channel.

Example 1

Figure 2:
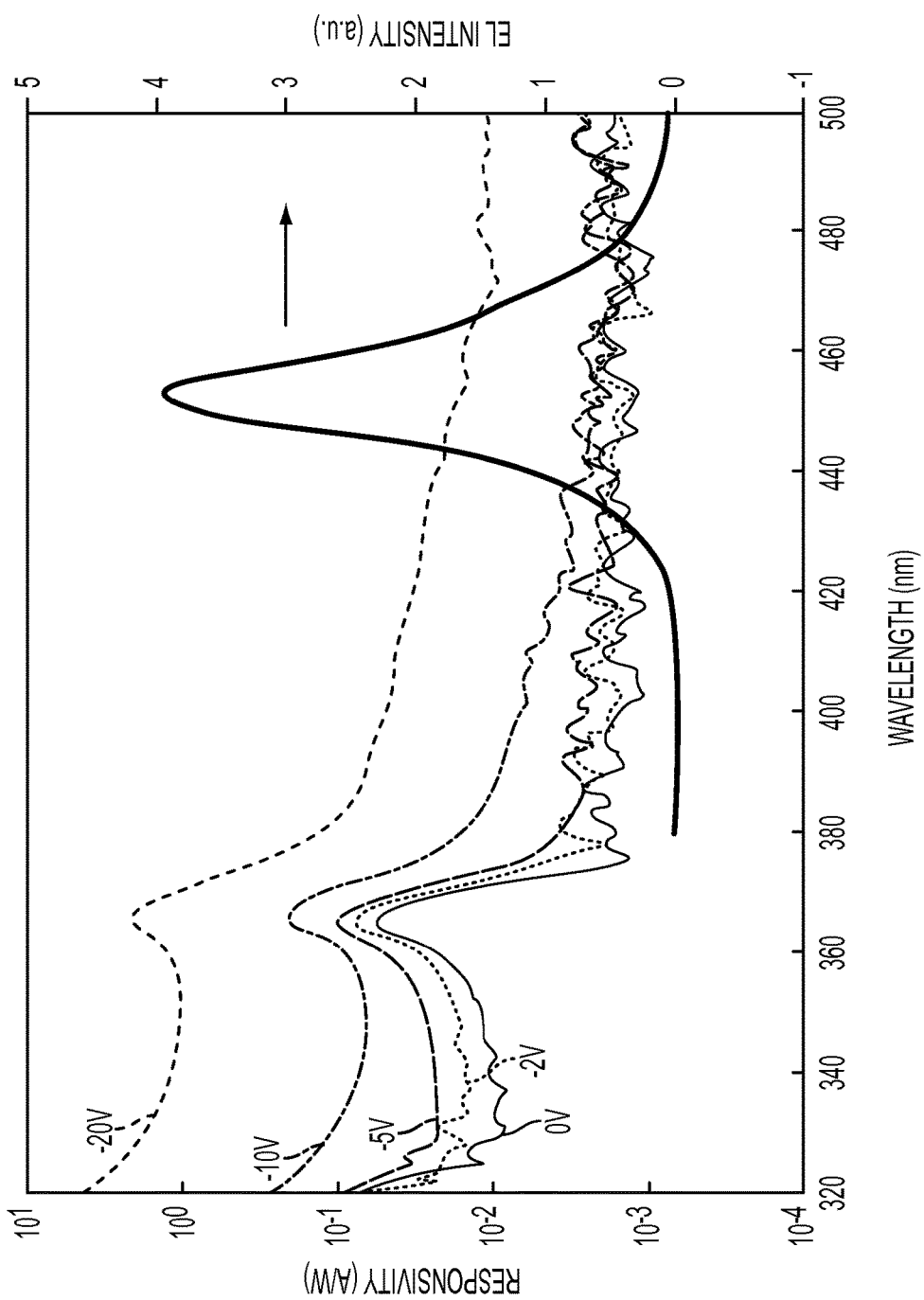
FIG. 2 is a graph depicting responsivity spectra of an ultraviolet photodetector at different voltage biases.

FIG. 2 shows the responsivity spectra of a GaN photodetector at −20 V, −10 V, −5 V and 0 V respectively. The peak values of responsivity at 365 nm are 2.04 $AW^{-1}$, 0.2 $AW^{-1}$, 0.11 $AW^{-1}$, and 0.06 $AW^{-1}$ for −20 V, −10 V, −5 V, and 0 V reverse bias respectively, are associated with external quantum efficiencies of 693%, 73.5%, 37.4%, and 20.4% respectively. This result is comparable to typical epitaxially grown GaN Schottky barrier photodetectors (0.0413 $AW^{-1}$ at 350 nm; 0.18 $AW^{-1}$ at −5 V). A clear cut-off wavelength around 375 nm was observed. The responsivity value at 365 nm was nearly two orders of magnitude higher than that in the visible range (e.g. at 450 nm). Therefore, the photodetector exhibits appropriate responses for UV sensitive and visible-blind applications. FIG. 2 also superimposes the electroluminescence (EL) spectrum of the InGaN LED over the responsivity spectra. As depicted in the graph, the EL peak of the LED at 450 nm corresponds to a region where the GaN photodetector has little absorption.

Example 2

Figure 3:
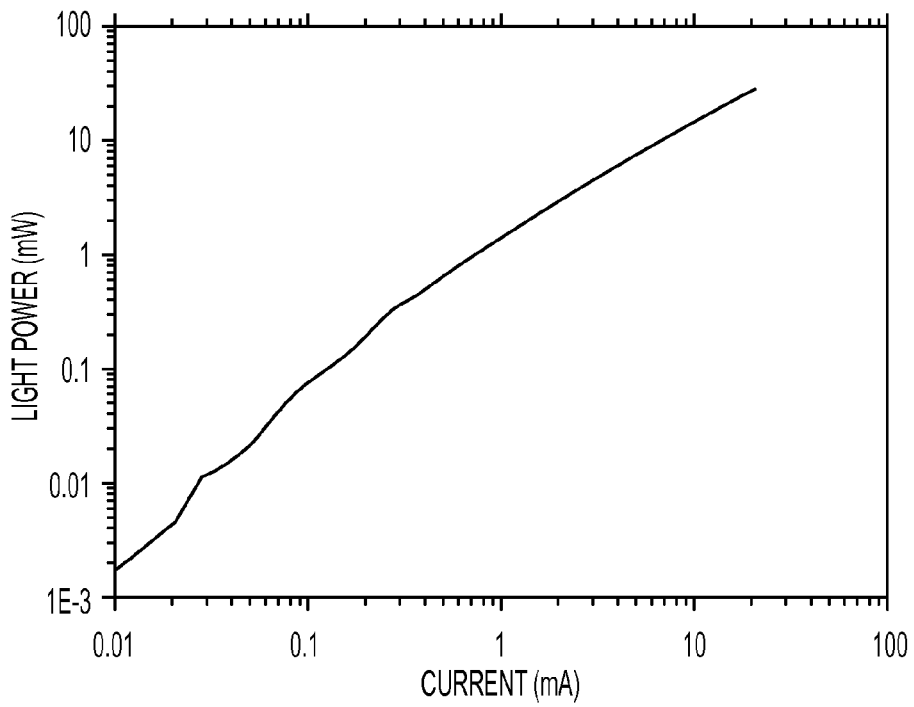
FIG. 3 is a graph depicting the light output power of the light emitting diode as a function of current.

FIG. 3 shows the LED light power output as a function of current. As depicted in the figure, the light power increases approximately linearly with increasing current.

Example 3

Figure 4:
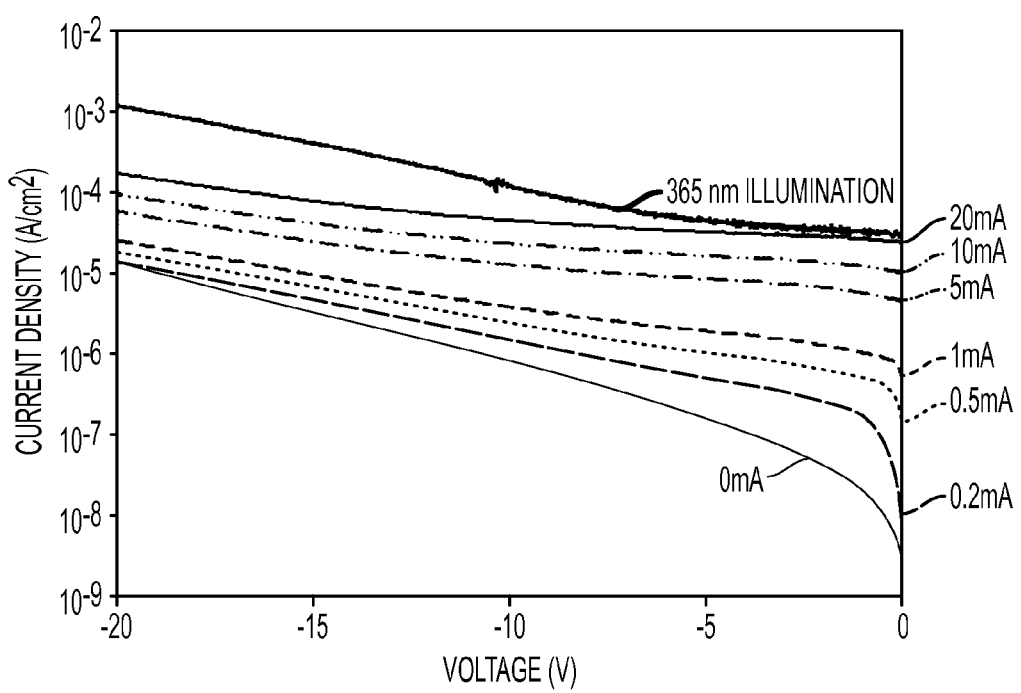
FIG. 4 is a graph of the current density of the ultraviolet photodetector for different currents through the neighboring light emitting diode.

FIG. 4 presents a graph of the current density versus voltage (I-V characteristics) of the GaN detector for various currents applied to the neighboring InGaN LED. The currents applied to the neighboring InGaN LED were 20 mA, 10 mA, 5 mA, 1 mA, 0.5 mA, 0.2 mA and 0 mA. The graph illustrates that the current density of the GaN photodetector increases monotonically with increasing InGaN LED current. Without wishing to be bound by theory, this means that the current density and the noise of the photodetector increase with increasing current applied to, and thus increased illumination from, the neighboring InGaN LED despite the relative non-absorbance of GaN relative to visible light. The defects at the surface of u-GaN, introduced by the ICP etch process, are likely the major contributors to absorbing the visible light from the neighboring LED. The line labeled as 365 nm illumination corresponds to the photocurrent of the photodetector using 365 nm illumination with a power intensity of $7.16\times10^{-4}$ $W/cm^2$. The results show that the photocurrent signal can be distinguished from the background noise caused by a neighboring LED if the illumination at 365 nm exceeds $7.16\times10^{-4}$ $W/cm^2$. To further identify the working range for an LED and GaN photodetector dual channel communication application, the photocurrent of the GaN photodetector as a function of reverse bias under various neighboring LED illuminations was also studied as described in more detail below.

Example 4

Figure 5:
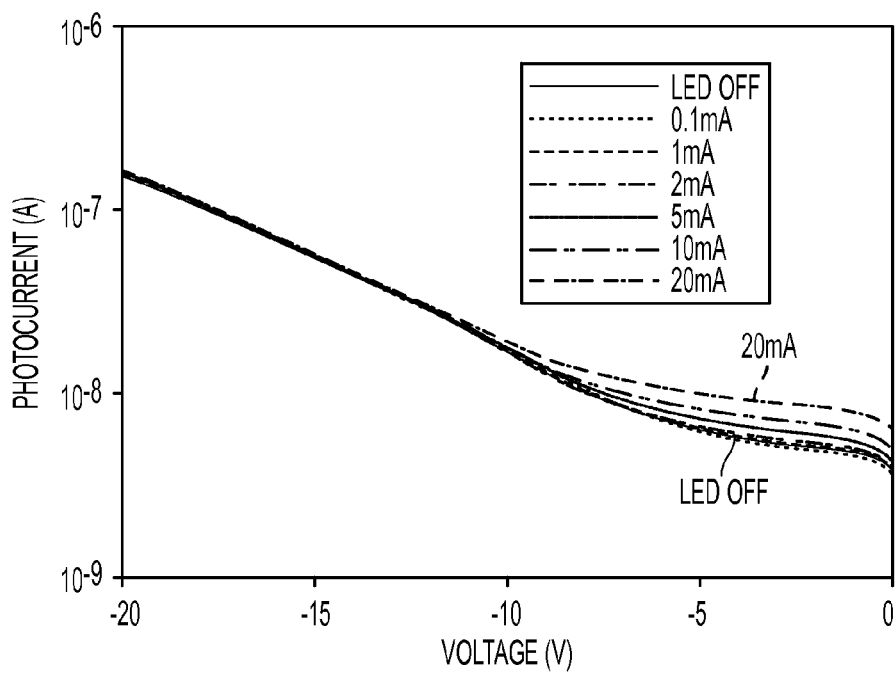
FIG. 5 is a graph of the photocurrent of the ultraviolet photodetector as a function of voltage and different currents applied to the neighboring light emitting diode.

FIG. 5 shows the photocurrent of the GaN photodetector for currents through the neighboring LED of 0 mA, 0.1 mA, 1 mA, 2 mA, 5 mA, 10 mA, and 20 mA. Using 365 nm illumination with a power intensity of $7.16\times10^{-4}$ $W/cm^2$, the photocurrents are almost independent of the neighboring LED when either the reverse bias is beyond about −10 V or the current through the LED is smaller than about 2 mA. When lower intensity UV illumination is applied, the working range of the GaN photodetectors could be expanded to enable detection in several ways. For example, the working range of the GaN photodetector might be increased by providing a reverse bias that is larger than about −10 V and/or using LED currents less than about 2 mA. These results illustrate that the LED and photodetector can work together very efficiently at the same time even under very small UV illumination with relatively low powers such as $7.16\times10^{-4}$ $W/cm^2$.

Example 5

Figure 6:
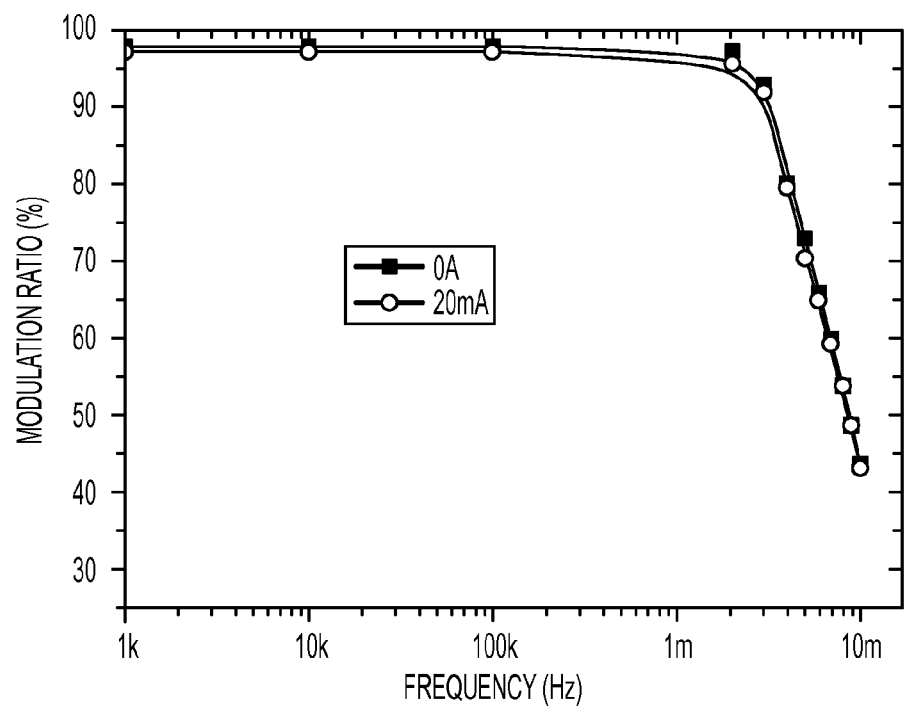
FIG. 6 is a graph of the modulation ratio of the ultraviolet light detector for different currents run through the neighboring light emitting diode.

FIG. 6 shows the modulation capacity of the GaN photodetector when the neighboring LED is OFF and when a 20 mA current is applied to the neighboring LED. Without wishing to be bound by any particular theory, the results show that the modulation frequency is almost independent of the neighboring LED. Additionally, the 3 dB bandwidth for the GaN photodetector is 5.4 MHz.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

The invention claimed is:

1. An integrated device comprising:
a substrate;
a light emitting diode formed on the substrate, comprising:
    an undoped material layer;
    an n-type material layer formed on a surface of the undoped material layer, a first surface of the n-type material layer having an n-type contact;
    a material layer having at least one quantum well formed on a second surface of the n-type material layer;
    a p-type material layer formed on a surface of the material layer having the at least one quantum well; and
    a p-type contact formed on a surface of the p-type material layer;
a photodetector formed on the substrate, comprising:
    an undoped material layer with an n-type material layer formed on a first portion of a surface of the undoped material layer and a Schottky contact formed on a second portion of the surface of the undoped material layer; and,
    an n-type contact formed on a surface of the n-type material layer;
wherein the photodetector is separated from the light emitting diode by a distance; and,
wherein the photodetector is configured to be blind to emissions from the light emitting diode.

2. The integrated device of claim 1, wherein the light emitting diode and the photodetector are formed with one or more layers comprising III-nitride.

3. The integrated device of claim 2, wherein the one or more layers comprise at least one of gallium nitride (GaN) and indium gallium nitride (InGaN).

4. The integrated device of claim 1, wherein the light emitting diode is configured to function as an optical transmitter and the photodetector is configured to function as an optical receiver.

5. The integrated device of claim 4, wherein the light emitting diode is also configured to function as a solid-state light.

6. The integrated device of claim 1, wherein the photodetector is capable of receiving signals and the light emitting diode is capable of transmitting signals without cross-talk.

7. The integrated device of claim 1, wherein the light emitting diode is configured to emit wavelengths in the visible spectrum and the photodetector is configured to receive wavelengths in the ultraviolet spectrum.

8. The integrated device of claim 1, wherein the photodetector comprises at least one of a pn junction photodetector, p-i-n junction photodetector, and a metal-semiconductor-metal photo detector.

9. The integrated device of claim 1, wherein the Schottky contact is configured to form a Schottky barrier photodetector.

10. A device comprising:
a light emitting diode formed on a substrate, the light emitting diode comprising:
    an undoped material layer;
    an n-type material layer, a surface of the n-type material layer having an n-type contact;
    a material layer having at least one quantum well;
    a p-type material layer; and
    a p-type contact;
    wherein the light emitting diode is configured to function as both a solid state light and as an optical transmitter;
a photodetector formed on the substrate, the photodetector comprising:
    an undoped material layer, at least a portion of which having an n-type material layer and a Schottky contact and,
    an n-type contact;
    wherein the photodetector is configured to be blind to emissions from the light emitting diode;
wherein the photodetector is separated from the light emitting diode by a distance.

11. The device of claim 10, wherein the photodetector is configured to function as an optical receiver.

12. The device of claim 10, wherein the photodetector is capable of receiving signals and the light emitting diode is capable of transmitting signals without cross-talk.

13. The device of claim 10, wherein the light emitting diode is configured to emit wavelengths in the visible spectrum and the photodetector is configured to receive wavelengths in the ultraviolet spectrum.

14. The device of claim 10, wherein the photodetector comprises at least one of a p-n junction photodetector, p-i-n junction photodetector, and a metal-semiconductor-metal photodetector.

15. The device of claim 10, wherein the Schottky contact is configured to form a Schottky barrier photodetector.

16. An optical communication system comprising:
a first transmitting light emitting diode associated with a first receiving photodetector;
a second transmitting light emitting diode associated with a second receiving photodetector, wherein the first receiving photodetector is configured to be blind to the first light emitting diode and configured to receive emissions from the second light emitting diode, and wherein the second receiving photodetector is configured to be blind to the second light emitting diode and configured to receive emissions from the first light emitting diode.

17. The optical communication system of claim 16, wherein the first light emitting diode is configured to emit light in the visible spectrum, wherein the first receiving photodetector is configured to receive light in the ultraviolet spectrum, wherein the second light emitting diode is configured to emit light in the ultraviolet spectrum, and wherein the second receiving photodetector is configured to receive light in the visible spectrum.

18. The optical communication system of claim 16, wherein at least one of the first light emitting diode and second light emitting diode is also configured to function as a solid state light.

19. The optical communication system of claim 16, wherein the first photodetector and second photodetector comprise a Schottky barrier photodetector.

20. The optical communication system of claim 16, wherein the first light emitting diode and first receiving photodetector are formed on a first substrate, and wherein the first light emitting diode and first receiving photodetector are formed on a second substrate.

\* \* \* \* \*